United States Patent [19]

Johansson

[11] 4,439,802
[45] Mar. 27, 1984

[54] OVERVOLTAGE GUARD FOR ELECTRONIC CIRCUITS

[75] Inventor: Jan H. Johansson, Bålsta, Sweden

[73] Assignee: Telefonaktiebolaget L M Ericsson, Stockholm, Sweden

[21] Appl. No.: 292,900

[22] Filed: Aug. 14, 1981

[30] Foreign Application Priority Data

Sep. 26, 1980 [SE] Sweden ................................ 8006773

[51] Int. Cl.³ .......................... H02H 7/20; H02H 3/20
[52] U.S. Cl. ......................................... 361/56; 361/91; 361/111
[58] Field of Search .................... 361/56, 91, 110, 111; 307/130, 350, 351, 252 R, 252 L

[56] References Cited

U.S. PATENT DOCUMENTS

| 3,449,598 | 6/1969 | Wright | 361/56 X |
| 3,660,724 | 5/1972 | Berger | 361/56 |
| 3,689,800 | 9/1972 | Lav et al. | 361/56 X |
| 3,790,856 | 2/1974 | Hutchinson | 361/56 |
| 3,988,695 | 10/1976 | Mattfeld et al. | 361/56 X |
| 4,099,074 | 7/1978 | Maeda et al. | 361/56 X |
| 4,264,941 | 4/1981 | London | 361/56 X |

Primary Examiner—Patrick R. Salce

[57] ABSTRACT

An overvoltage guard for electronic circuits protects the connections from voltage transients which exceed the supply voltage of the circuit. The transients are bypassed to the grounded terminal of the supply voltage source by a thyristor connected between the terminal and the grounded terminal, the gate electrode of the thyristor being connected to the ungrounded terminal via a diode. Between the terminal and the grounded terminal there is conventionally connected a limiting diode.

6 Claims, 2 Drawing Figures

OVERVOLTAGE GUARD FOR ELECTRONIC CIRCUITS

TECHNICAL FIELD

The invention relates to an overvoltage guard for electronic circuits, e.g., in telephone equipment, suitable for being executed with the aid of integrated circuit technology.

BACKGROUND ART

Depending on the field of use, electronic circuits are more or less subject to overvoltages on their inputs, which are caused by atmospheric discharges, for example. A typical example is the amplifying and signalling circuits in the line circuits for telephone exchanges, where the inputs and outputs can be subjected to overvoltages via the subscriber lines. These circuits are therefore provided with different forms of overvoltage protection which can be incorporated in the circuit itself, or adjacent it depending on the currents which must be led off.

If the electronic circuit is of the monolithic type then it can hardly withstand voltages in excess of the supplied voltage. At the same time it is desired that the circuit will cope with signal voltages in the vicinity of the supply voltage. It is therefore desirable that the potential of the input and output connections can vary within the normal voltage range of the source of current supply, but not appreciably outside this range.

A known method of protecting circuits for overvoltages in this way is to make each connection to the supply voltage terminals through limiting diodes, which are turned so that they are non-conducting as long as the connection potential falls below the potential of the voltage source positive terminal, but exceeds the potential of its negative terminal. The connection potential can therefore not exceed the positive terminal potential or fall below the negative terminal potential by more than one diode voltage drop. One terminal of the voltage source is grounded in many cases. In this circuit there will be an overvoltage in relation to ground, which is led off over a diode to the ungrounded terminal of the voltage source, to give a current which is not taken directly to ground but psses the voltage source. Depending on the internal impedance of the source, and the wave form of the overvoltage, unpermitted high voltages can therefore occur on the input in spite of the overvoltage guard.

A known possibility of avoiding this problem is to connect a diode, which is connected to the grounded terminal on the voltage source, in parallel with a varistor. The varistor is then dimensioned to lead such overvoltages to ground which cannot be taken away through the other diode and the internal impedance of the voltage source. In another known circuit, the varistor is replaced by the anode-cathode circuit in a thyristor. The thyristor gate is connected through a Zener diode to the grounded terminal of the voltage source. When the voltage difference between the connection and the grounded terminal is greater than the Zener voltage, the thyristor becomes conducting and the overvoltage is taken to ground. Both varistor and Zener diode must be selected with regard to the supply voltage for the guard to come into operation at the right level.

DISCLOSURE OF INVENTION

The known circuits with thyristor plus Zener diode or varistor, which are described above, are dependent on the supply voltage and therefore cannot be used if a variable supply voltage can otherwise be tolerated. Furthermore, both varistors and Zener diodes get a large spread at the knee of the current-voltage curve during manufacture, signifying that the voltage durability of the protected circuit must have sufficient tolerances.

A switching arrangement in accordance with the invention prevents a point in an electric circuit from assuming a voltage relative to ground which appreciably exceeds the voltage of the ungrounded terminal of a circuit provided with a grounded terminal, and supplying the first-mentioned circuit with current, simultaneously as the overvoltage bypass takes place at lower impedance.

BRIEF DESCRIPTION OF DRAWING

The invention will now be described in detail while referring to the appended drawing, where.

PREFERRED EMBODIMENT

Figure 1:
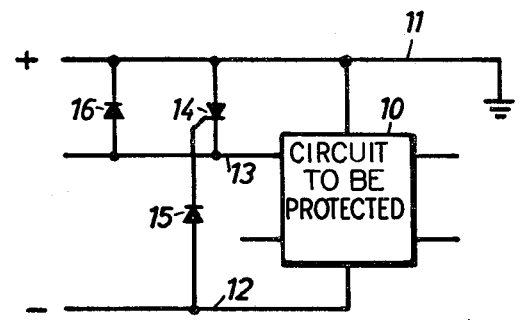
FIG. 1 illustrates a switching arrangement intended as an overvoltage guard in a positive grounded system, and FIG. 2 an equivalent switching arrangement intended for a negative grounded system.

An electric circuit is denoted by the numeral 10 in FIG. 1, the circuit comprising, for example, an integrated amplifier intended for connection to a telephone system. The numerals 10 and 12 denote wires, e.g. telephone lines, through which the circuit 11 is supplied with current. The positive wire 11 is grounded in this case, whereas the negative wire can have considerable impedance to earth. The circuit 10 has a plurality of inputs and outputs for signals, of which one such terminal 13 normally has high impedance to the terminal of the current source. Between the terminal 13 and the grounded positive wire 11 there is connected a thyristor 14, with forward direction from ground to the wire 11, there also being a diode 16 with its forward direction from the terminal 13 to ground. The thyristor 14 is provided with a cathode gate which is connected to the negative wire 12 via diode 15, with the forward direction from the negative wire to the cathode gate. The thyristor 14 and diode 16 are normally blocked when the connection has a potential within the plus and minus limits of the voltage source.

The arrangement functions in the following way. If the terminal 13 is subjected to a voltage transient causing the terminal 13 to be more negative than the negative terminal of the current source, the diode 15 becomes conductive and the gate of the thyristor 14 gets current. The thyristor 14 continuous to be conductive until the voltage of the terminal 13 rises above the level of the negative terminal, when the thyristor anode-cathode current path is interrupted. By the thyristor becoming conductive for a voltage which is only some volts under that of the negative terminal (a diode voltage drop + the activation voltage of the thyristor) activation to conductivity will be related to the pole voltage of the voltage source the whole time, and the circuit can be used for all supply voltages within the operating range of the connection. A limiting diode 16, preventing the voltage at the terminal 13 from exceeding the positive terminal voltage, is provided conventionally for overvoltages in the positive direction.

Figure 2:
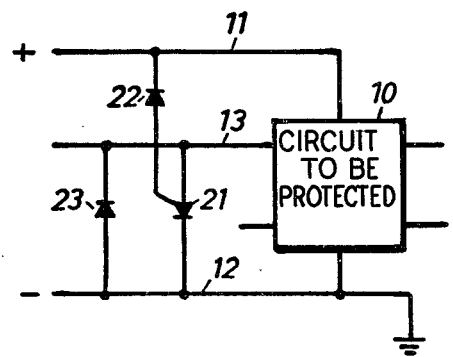

A corresponding switching arrangement is illustrated in FIG. 2, for a negative grounded supply. In this case the thyristor 21 is connected between the terminal 13 and the negative wire 12 with its forward direction towards the negative wire. The anode gate on the thyristor 21 is connected to the positive wire 11 in series with the diode 22 with its forward direction to the gate plus pole. The function is entirely equivalent to the one described in FIG. 1. As soon as the terminal 13 has a voltage exceeding the plus voltage, the diode 22 and anode-anode gate section in the thyristor 21 become conductive and the thyristor 21 is activated.

In the figures, the protective circuits 14–16 and 21–23 have been shown situated outside the circuit 10, which in normal cases is a monolithic integrated circuit. In certain cases when the currents which are bypassed are not too high, it is possible to arrange the protective circuits on the same semiconductor wafer. All the other components which are incorporated can then be made in the diffusion processes otherwise normal for the circuit.

I claim:

1. In a circuit which is supplied by a current source having positive and negative terminals wherein one of said terminals is grounded and the other of said terminals is ungrounded, and having a signal point, overvoltage prevention apparatus for preventing the signal point in response to a transient voltage from attaining a voltage having an absolute value which significantly exceeds the absolute value of the voltage of the ungrounded terminal wih respect to ground comprising a triggerable electronic current switch means for interconnecting the signal point and ground and having a trigger input, and unidirectional conducting means for connecting the trigger input of said triggerable electronic current switch means and the ungrounded terminal of said current source, said unidirectional conducting means being biased to conduct when the voltage of said signal point begins to exceed in the same polarity the voltage of the ungrounded terminal of said current source whereby said triggerable electronic current switch means is triggered to conduction thereby limiting the amount of the voltage by which said signal point exceeds the voltage of the ungrounded terminal.

2. The apparatus of claim 1 wherein said triggerable electronic current switch means is a thyristor whose cathode gate is said trigger input.

3. The apparatus of claim 2 wherein the grounded terminal of said current source is positive with respect to the ungrounded terminal and said unidirectional conducting means is a diode having a cathode connected to the cathode gate of said thyristor and an anode connected to the ungrounded terminal of said current source.

4. The apparatus of claim 3 further comprising a second diode having a cathode connected to said signal point and an anode connected to the grounded terminal of said current source.

5. The apparatus of claim 2 wherein the grounded terminal of said current source is negative with respect to the ungrounded terminal and said unidirectional conducting means is a diode having an anode connected to the cathode gate of said thyristor and a cathode connected to the ungrounded terminal of said current source.

6. The apparatus of claim 5 further comprising a second diode having an anode connected to said signal point and a cathode connected to the ungrounded terminal of said current source.

* * * * *